(12) United States Patent
Kan

(10) Patent No.: US 8,261,012 B2
(45) Date of Patent: Sep. 4, 2012

(54) NON-VOLATILE SEMICONDUCTOR MEMORY COMPRISING POWER FAIL CIRCUITRY FOR FLUSHING WRITE DATA IN RESPONSE TO A POWER FAIL SIGNAL

(75) Inventor: Alan Chingtao Kan, Diamond Bar, CA (US)

(73) Assignee: Western Digital Technologies, Inc., Irvine, CA (US)

(*) Notice: Subject to any disclaimer, the term of this patent is extended or adjusted under 35 U.S.C. 154(b) by 354 days.

(21) Appl. No.: 12/610,073

(22) Filed: Oct. 30, 2009

(65) Prior Publication Data

US 2011/0107012 A1 May 5, 2011

(51) Int. Cl.
G06F 12/16 (2006.01)
G06F 11/16 (2006.01)

(52) U.S. Cl. ............ 711/103; 711/135; 714/14
(58) Field of Classification Search .......... None
See application file for complete search history.

(56) References Cited

U.S. PATENT DOCUMENTS

| | | | |
|---|---|---|---|
| 6,985,778 B2 | 1/2006 | Kim et al. | |
| 7,136,307 B2 | 11/2006 | Piersimoni et al. | |
| 7,243,185 B2 | 7/2007 | See et al. | |
| 7,421,552 B2 * | 9/2008 | Long | 711/162 |
| 7,954,006 B1 * | 5/2011 | Mangipudi | 714/22 |
| 7,990,797 B2 * | 8/2011 | Moshayedi et al. | 365/229 |
| 2007/0006013 A1 | 1/2007 | Moshayedi et al. | |
| 2008/0126682 A1 | 5/2008 | Zhao et al. | |
| 2009/0094411 A1 | 4/2009 | Que | |

OTHER PUBLICATIONS

ONFI, "Open NAND Flash Interface Specification: Block Abstracted NAND", http://onfi.org/wp-content/uploads/2009/02/onfi_ba_nand_1_0_gold.pdf, Jul. 18, 2007.

* cited by examiner

Primary Examiner — Gary Portka

(57) ABSTRACT

A non-volatile semiconductor memory is disclosed comprising a first memory device having a memory array including a plurality of memory segments, and a data register for storing write data prior to being written to one of the memory segments. A memory controller comprises a microprocessor for executing access commands received from a host. Interface circuitry generates control signals that enable the microprocessor to communicate with the first memory device. Power fail circuitry transmits a flush command to the first memory device through the interface circuitry in response to a power fail signal, wherein the first memory device responds to the flush command by transferring the write data stored in the data register to the memory segment.

12 Claims, 8 Drawing Sheets

NON-VOLATILE SEMICONDUCTOR MEMORY COMPRISING POWER FAIL CIRCUITRY FOR FLUSHING WRITE DATA IN RESPONSE TO A POWER FAIL SIGNAL

BACKGROUND

A non-volatile semiconductor memory may be employed as mass storage for a computer system (e.g., desktop, laptop, portable, etc.) or a consumer device (e.g., music player, cell phone, camera, etc.) or other suitable application. The non-volatile semiconductor memory may comprise one or more memory devices (such as a flash memory) and control circuitry for accessing each memory device. Each memory device is coupled to an I/O bus, as well as a number of interface control lines. When issuing a program command or an erase command to a memory device, the control circuitry transfers the address and command data (and write data for a program operation) over the I/O bus. When issuing a read command, the control circuitry transfers the address and command data over the I/O bus and then receives the read data over the I/O bus.

FIG. 1 shows a prior art non-volatile semiconductor memory 2 communicating with a host 4 according to a suitable communication protocol. A memory controller 6 comprises a buffer 8 for buffering data for write/read commands, and a microprocessor 10 executing control programs for various algorithms, such as a logical block address (LBA) to physical block address (PBA) mapping, wear leveling, error correction code, etc. The memory controller 6 further comprises interface circuitry 12 for interfacing with one or more memory devices 14, such as a suitable flash memory device. The interface circuitry 12 generates suitable control signals 16 and receives status information 18 from the memory device 14 in connection with executing write/read commands initiated by the microprocessor 10. The interface circuitry 12 also transmits and receives data over an I/O bus 20, including read/write data stored in the buffer 8 or command data generated by the microprocessor 10 and transmitted to a controller 22 integrated with the memory device 14.

The memory device 14 comprises an array of memory cells 24 that are accessed in memory segments referred to as pages. During a write operation, write data received over the I/O bus 20 from the buffer 8 is first stored in a data register 26. The controller 22 then transfers the write data from the data register 26 to a target page in the memory array 24. During a read operation, a page in the memory array 24 is read into the data register 26 and then transferred over the I/O bus 20 where it is stored in the buffer 8.

During a write operation, the memory device 14 will typically only flush the write data stored in the data register 26 to a page in the memory array 24 in response to a flush command received from the microprocessor 10 of the memory controller 6. For example, the write sequence for a typical flash memory is to issue a 30h command, followed by the address to store the data in the memory array 24, followed by a 10h command which instructs the controller 22 to transfer the write data stored in the data register 26 to the target page in the memory array 24. This implementation allows the memory controller to transmit partial pages of memory at a time before transmitting a flush command. For example, if the non-volatile semiconductor memory 2 implements a solid state drive (SSD), each data sector of the SSD may be less than the page size of the memory array 24 (e.g., 512 byte sector size and 2 k byte page size). The memory controller 6 may transmit a data sector at a time to the memory device 14 during "single sector" write operations, and after transmitting enough data sectors to fill a page, transmit a flush command (e.g., 10h) to flush the write data from the data register 26 to the target page in the memory array 24. However, if a power failure occurs after executing a number of single sector write operations but prior to issuing the flush command, the write data cached in the data register 26 may be lost.

DETAILED DESCRIPTION OF EMBODIMENTS OF THE INVENTION

Figure 1:
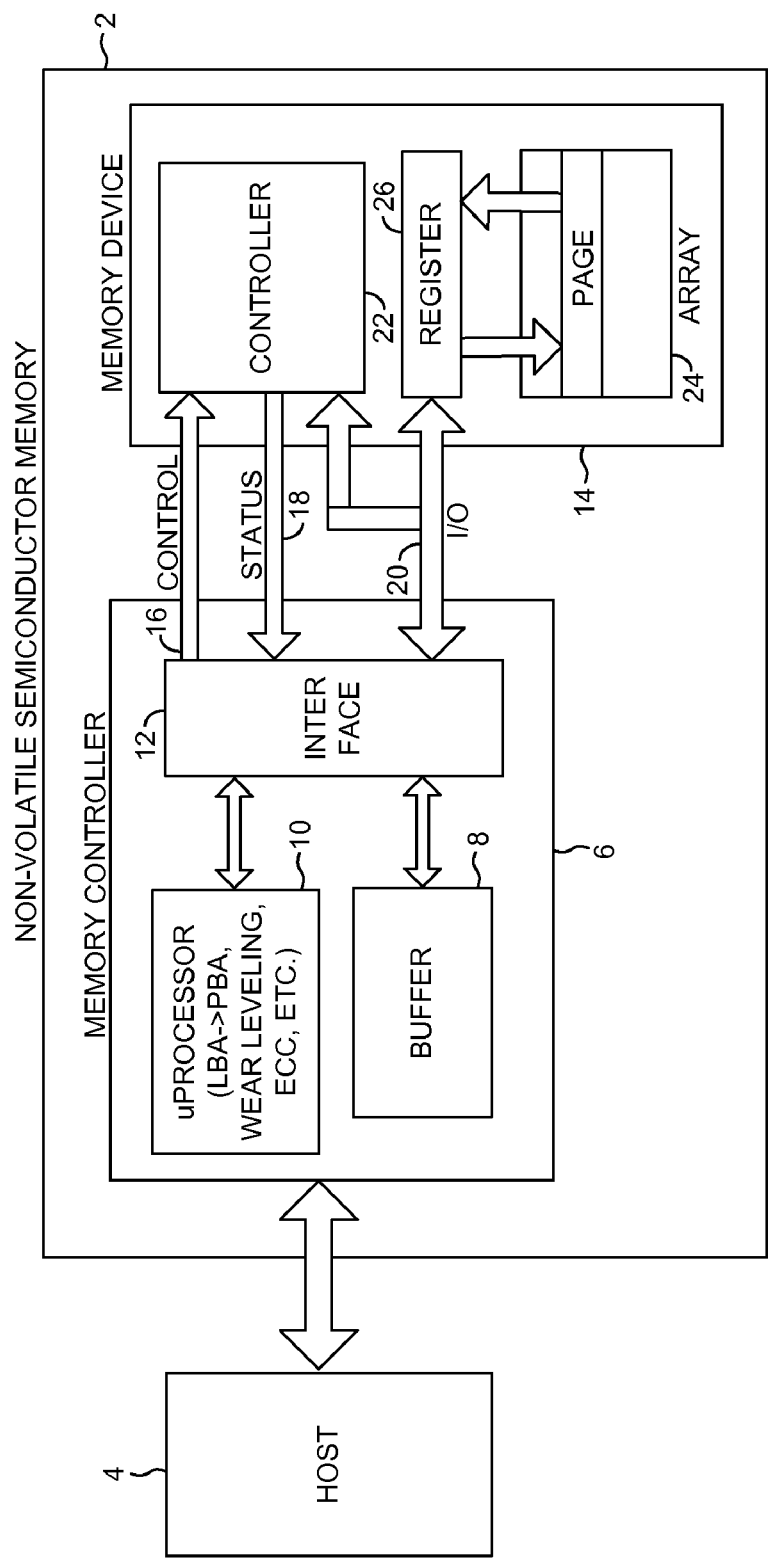
FIG. 1 shows a prior art non-volatile semiconductor memory comprising a memory device, a microprocessor for executing access commands received from a host, and interface circuitry for interfacing with the memory device.
Figure 2A:
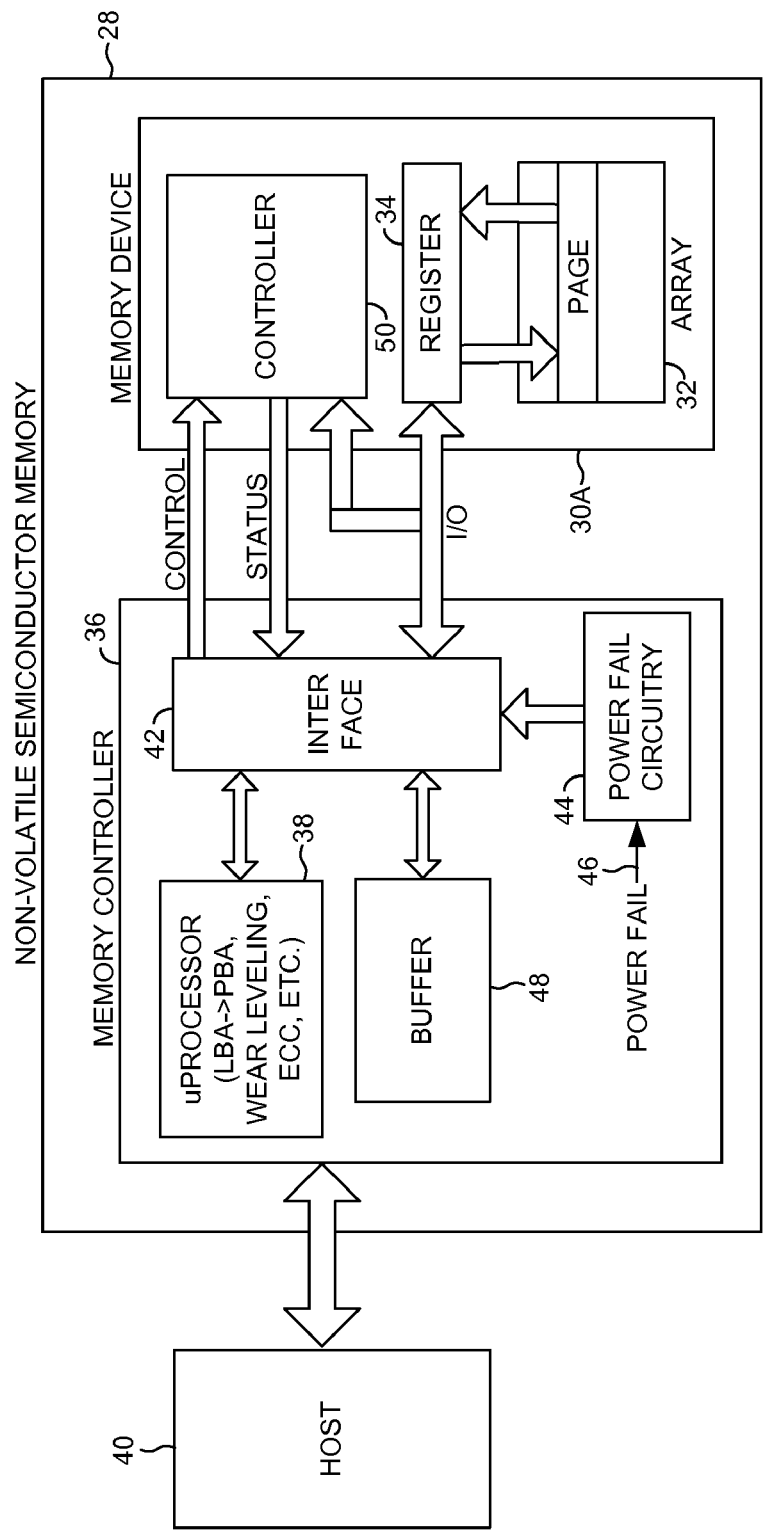
FIG. 2A shows a non-volatile semiconductor memory according to an embodiment of the present invention comprising power fail circuitry for transmitting a flush command to a memory device independent of the microprocessor.

FIG. 2A shows a non-volatile semiconductor memory 28 comprising a first memory device 30A having a memory array 32 including a plurality of memory segments, and a data register 34 for storing write data prior to being written to one of the memory segments. A memory controller 36 comprises a microprocessor 38 for executing access commands received from a host 40. Interface circuitry 42 generates control signals that enable the microprocessor 38 to communicate with the first memory device 30A. Power fail circuitry 44 transmits a flush command to the first memory device 30A through the interface circuitry 42 in response to a power fail signal 46, wherein the first memory device 30A responds to the flush command by transferring the write data stored in the data register 34 to the memory segment.

The non-volatile semiconductor memory 28 may comprise any suitable configuration of memory controller 36 and memory device 30A. In one embodiment, the memory device 30A comprises a suitable flash memory (e.g., NAND or NOR flash), and the memory controller 36 comprises a suitable flash controller. In one embodiment, the memory controller 36 implements a solid state drive (SSD) by emulating a disk drive accessible by a host system using a standard disk drive communication protocol (e.g., the ATA protocol). The host 40 in this embodiment may comprise a separate microprocessor (e.g., in a desktop or laptop computer) which communicates with the SSD over a suitable interface (e.g., serial or parallel ATA). In an alternative embodiment, the non-volatile semiconductor memory 28 may be implemented within a consumer device (e.g., a camera or cell phone), wherein the host 40 may be implemented as a firmware component executed by the same microprocessor 38 for implementing the memory controller 36.

In one embodiment, the memory controller 36 comprises a volatile memory (e.g., DRAM) implementing a buffer 48 for caching data that is written to the memory device 30A and read from the memory device 30A. The interface circuitry 42 comprises suitable state machine circuitry for accessing the buffer 48 during write/read operations. The memory device 30A comprises a controller 50 for receiving the control signals and command data from the interface circuitry 42. For example, the command data may comprise address information for writing data to a particular memory segment in the memory array 32. The write data is buffered in the data register 34 and when the controller 50 receives a flush command, the controller 50 transfers the data buffered in the data register 34 to the target memory segment in the memory array 32.

In one embodiment, the memory controller 36 receives logical block addresses (LBAs) with access commands received from the host 40, and translates the LBAs into the corresponding physical block addresses (PBAs) of the memory device 30A. The LBA to PBA mapping facilitates mapping out defective memory segments from the memory array 32, as well as facilitate a wear leveling algorithm wherein write operations are distributed evenly over the memory segments in order to increase endurance. The memory controller 36 may also implement an error correction code (ECC) algorithm for generating redundancy data added to the user data for generating ECC codewords written to the memory segment. When performing an access operation (write/read operation), the microprocessor 38 programs registers in the interface circuitry 42 which are operated on by a state machine to carry out the access command by communicating with the memory device 30A. Offloading the access timing operations to the interface circuitry 42 enables the microprocessor 38 to simultaneously perform other operations, such as receiving subsequent access commands from the host 40.

In one embodiment, the memory array 32 in the memory device 30A comprises a plurality of blocks, wherein each block comprises a plurality of pages. Each page stores a plurality of bytes (e.g., 2 k bytes) corresponding to the size of the data register 34. The memory array 32 is programmed a page at a time from the data register 32, and the pages are erased a block at a time. In one embodiment, the memory controller 36 may perform write operations in segments that are smaller than the page size. For example, when implementing an SSD the memory controller 36 may perform write operations in segments referred to as data sectors, where the data sector size may be a fraction of the page size (e.g., 512 byte data sectors and 2 k byte pages). In some cases, a write operation may involve a small number of data sectors (e.g., one or two data sectors) such that the data register 34 may store data sectors for a number of different write commands. In one embodiment, the microprocessor 38 will not send a flush command to the memory device 30A until a sufficient number of write commands have been processed to fill up the data register 32.

During a power failure, if valid data is cached in the data register 32, the data will be lost unless it is flushed to the memory array 32 before the memory device 30A loses power. Therefore, when a power fail condition is detected, it is desirable to send a flush command to the memory device 30A as soon as possible to flush the data register 34 to the memory array 32 before the power supply falls below a safe level. In the embodiment of FIG. 2A, the non-volatile semiconductor memory 28 comprises power fail circuitry 44 for sending the flush command to the memory device 30A through the interface circuitry 42 in response to a power fail signal 46. Because the invention uses dedicated power fail circuitry 44 (e.g., independent of the microprocessor 38), the flush command is expeditiously transmitted to the memory device 30A. Any suitable flush command may be transmitted to the memory device 30A when a power fail condition is detected, such as the 10h flush command specified for a conventional flash memory.

Figure 2B:
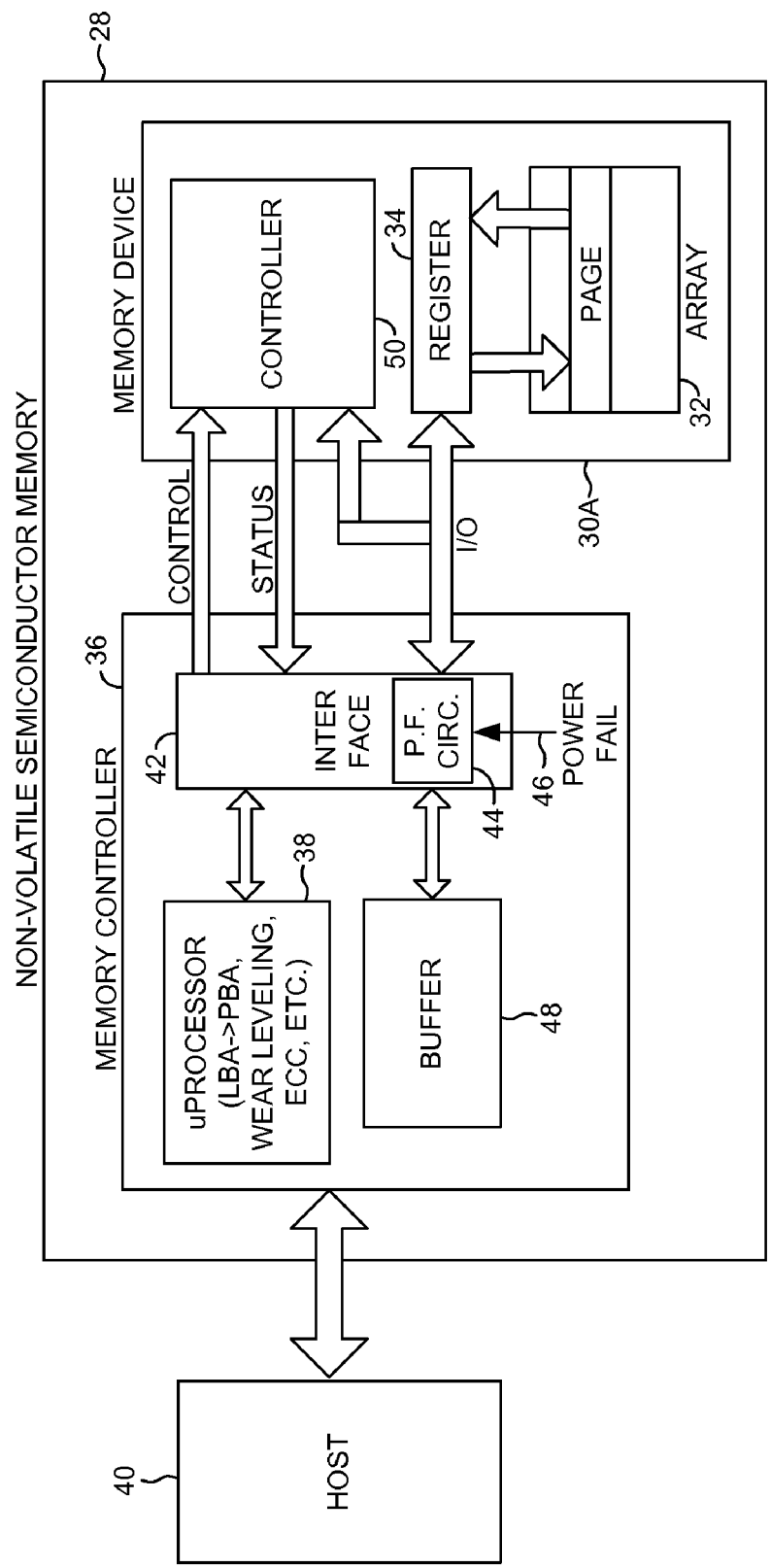
FIG. 2B shows an embodiment of the present invention wherein the power fail circuitry is integrated with the interface circuitry.

The power fail circuitry 44 may be implemented separate from the interface circuitry 42 (e.g., in a separate integrated circuit) as shown in FIG. 2A. In another embodiment shown in FIG. 2B, the power fail circuitry 44 is integrated with the interface circuitry 42 (e.g., on the same die).

Figure 3:
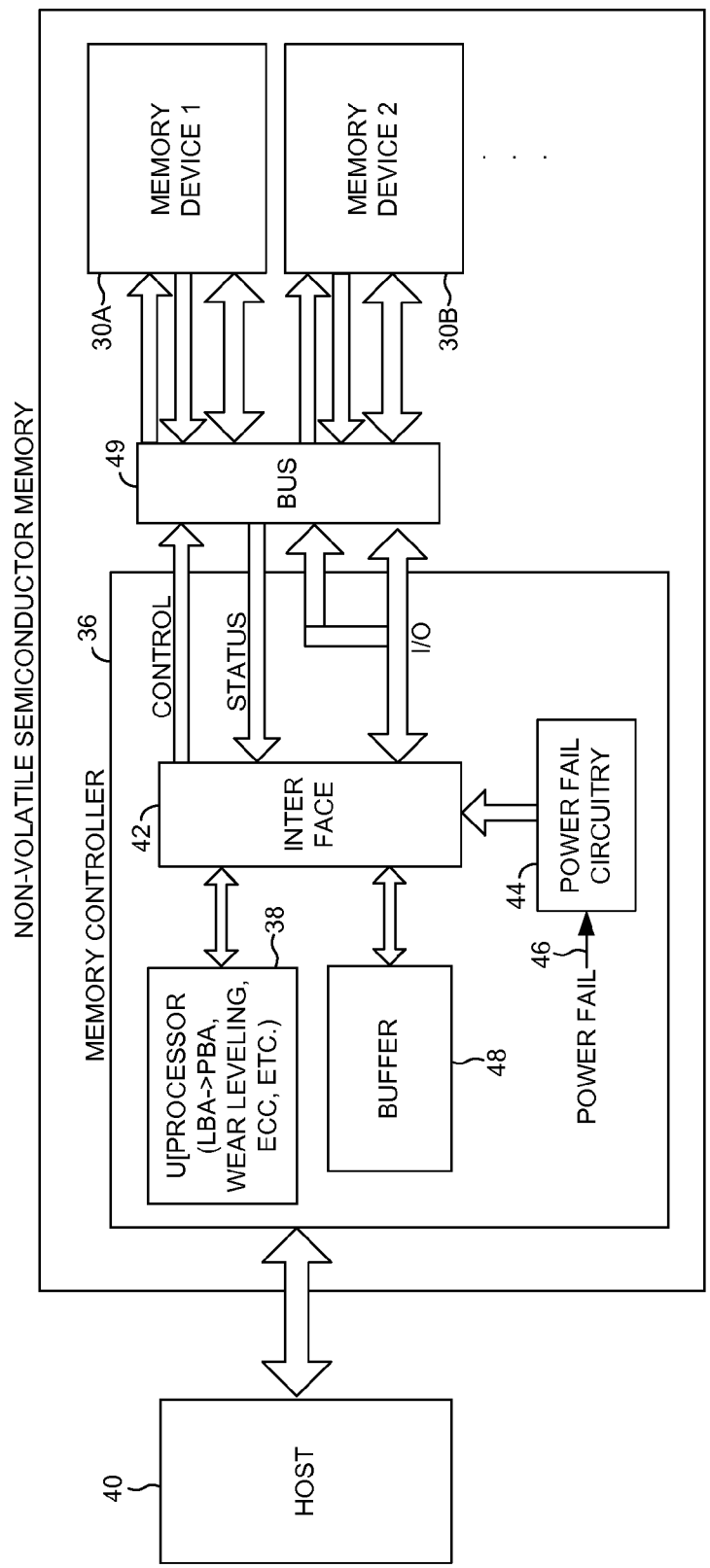
FIG. 3 shows a non-volatile semiconductor memory according to an embodiment of the present invention wherein the power fail circuitry transmits the flush command to a plurality of memory devices.

In an embodiment shown in FIG. 3, the non-volatile semiconductor memory 28 comprises a plurality of memory devices 30A, 30B, etc. When a power fail condition is detected, the power fail circuitry 44 transmits a flush command (e.g., 10h) to each memory device through the interface circuitry 42. In one embodiment, the memory devices 30A, 30B, etc. are connected to the interface circuitry 42 through a bus 49 that is active for the target memory device. In one embodiment, the bus 49 is implemented as a wired-OR bus where the interface pins of the memory devices are tristated until selected by a chip enable (CE) signal.

Figure 4:
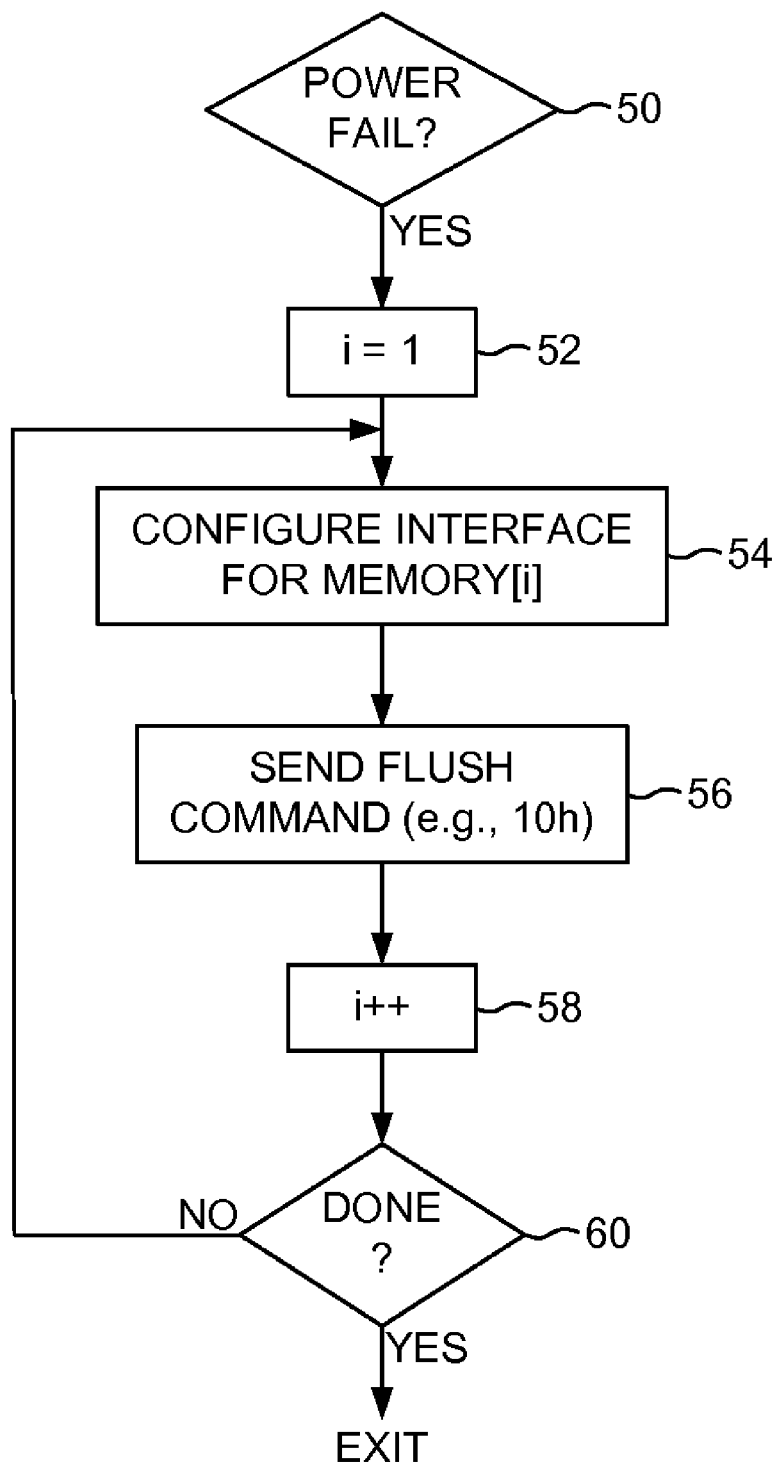
FIG. 4 shows a flow diagram according to an embodiment of the present invention wherein a flush command is transmitted to each memory device in response to a power fail condition.

The embodiment employing multi memory devices is further understood with reference to the flow diagram of FIG. 4 wherein when a power fail condition is detected (step 50), a counter i is initialized to one (step 52). A loop is then executed wherein the interface circuitry 42 is configured to transmit a command to memory device[i] (step 54), and a flush command transmitted to memory device[i] (step 56). The counter i is incremented (step 58) and the process repeated starting at step 54 until a flush command has been sent to all of the memory devices (step 60).

Figure 5:
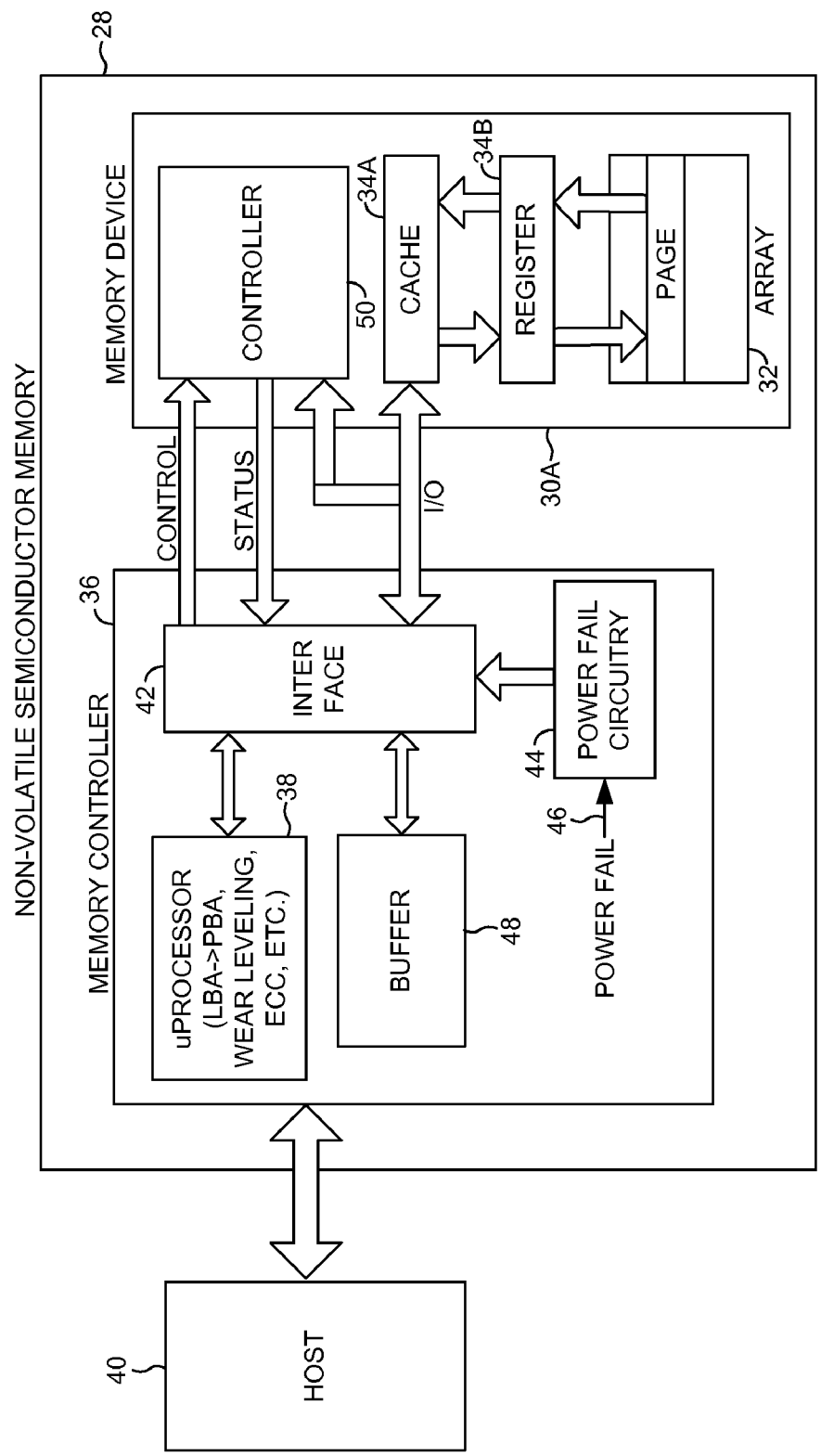
FIG. 5 shows a non-volatile semiconductor memory according to an embodiment of the present invention wherein the data register that is flushed comprises a cache register.

FIG. 5 shows an embodiment of the present invention wherein the data register 34 in the memory device 30A comprises a cache register 34A for caching write/read data. For example, during a write operation the write data is first cached in the cached register 34A and then transferred to register 34B. While programming a page in the memory array 32 with register 34B, the cache register 34A is free to receive write data for a next write command. When a power fail condition is detected, the flush command transmitted by the power fail circuitry 44 causes the write data cached in the cache register 34A to be transferred to register 34B and then programmed to a page in the memory array 32.

Figure 6:
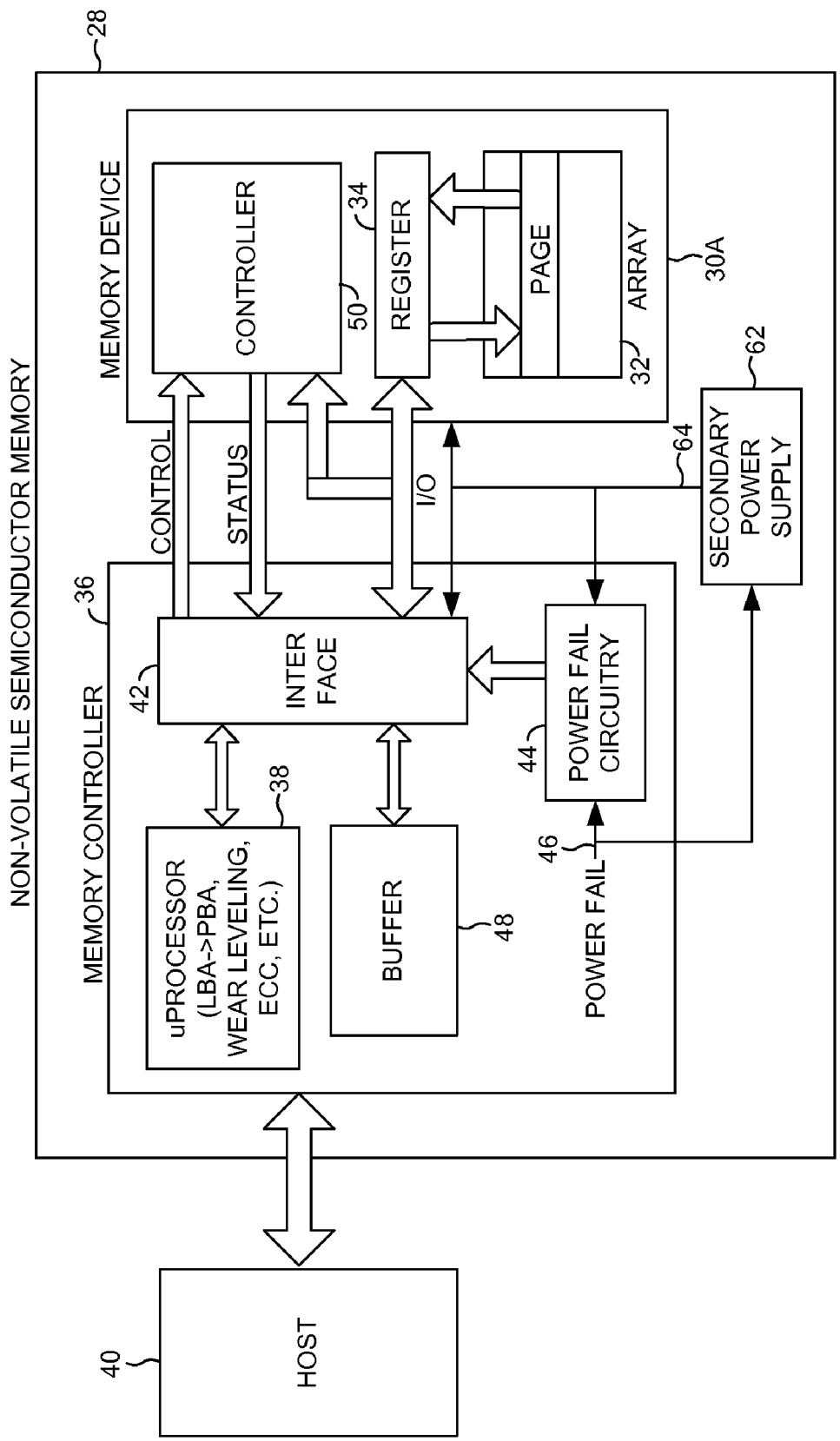
FIG. 6 shows a non-volatile semiconductor memory according to an embodiment of the present invention wherein a secondary power supply powers the power fail circuitry, interface circuitry, and memory device during a power fail flush operation.

FIG. 6 shows an embodiment of the present invention wherein the non-volatile semiconductor memory 28 comprises a secondary power supply 62 such as a capacitor or other type of battery. When the supply voltage from a primary power supply (not shown) falls below a threshold, the power fail signal 46 applies a secondary supply voltage 64 to the power fail circuitry 44, the interface circuitry 42, and the memory device 30A to enable the flush command to be transmitted and processed. In one embodiment, the size and cost of the secondary power supply 62 is reduced because the secondary supply voltage 64 does not need to supply power to other components, such as the microprocessor 38.

Figure 7A:
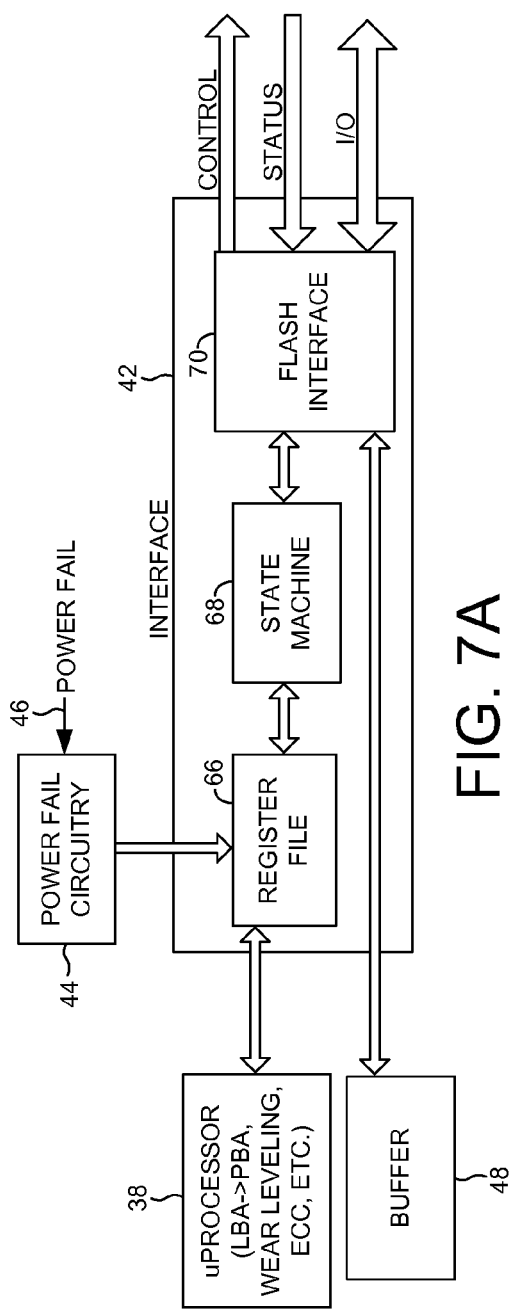
FIG. 7A shows interface circuitry according to an embodiment of the present invention wherein the power fail circuitry overwrites a register in a register file with the flush command.
Figure 7B:
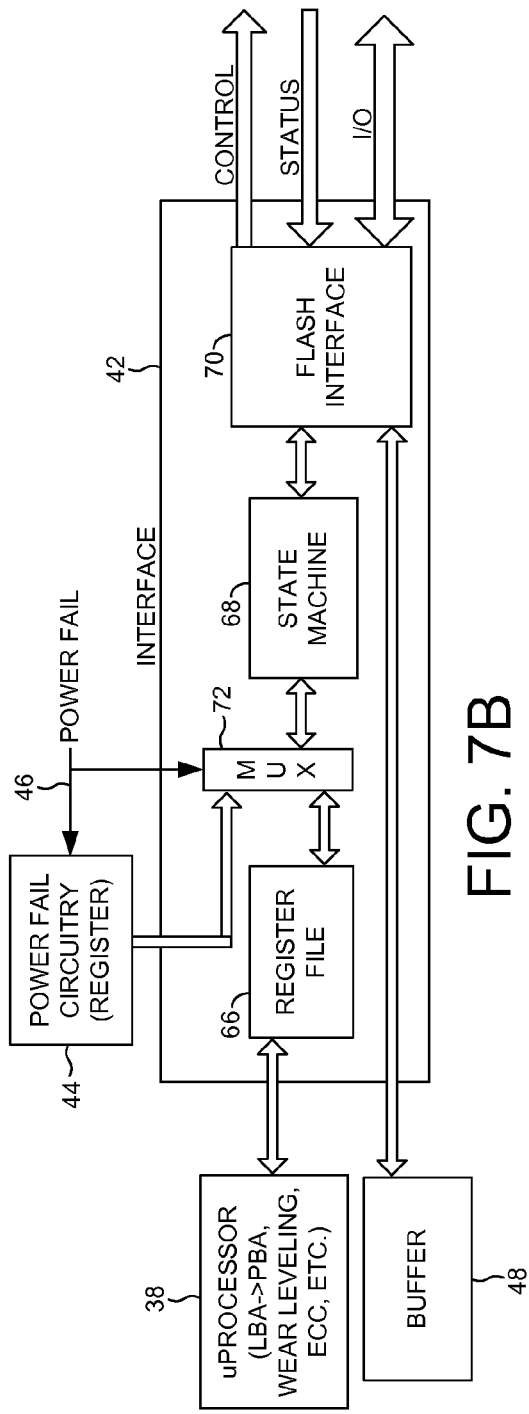
FIG. 7B shows interface circuitry according to an embodiment of the present invention wherein a register comprising the flush command is muxed into a state machine when a power fail condition is detected.

The power fail circuitry 44 and interface circuitry 42 may be implemented in any suitable manner. FIG. 7A shows an embodiment of the interface circuitry 42 comprising a register file 66 and state machine 68. To initiate an access command, the microprocessor 38 writes control data to registers in the register file 66 which the state machine 68 operates on to generate the appropriate control and command data with the appropriate timing through flash interface circuitry 70. When a power fail condition is detected, the power fail circuitry 44 interrupts the current access command initiated by the microprocessor 38 by overwriting the register file 66 with suitable command data to cause a flush command to be transmitted to the memory device. FIG. 7B shows an alternative embodiment for the interface circuitry 42 wherein during normal operation a multiplexer 72 applies the control data from the register file 66 to the state machine 68, and during a power fail condition, the multiplexer 72 is configured to apply register data from the power fail circuitry 44 to the state machine circuitry 68. This latter embodiment may further expedite transmitting the flush command by avoiding the latency associated with overwriting the registers in the register file 66.

What is claimed is:

1. A non-volatile semiconductor memory comprising:
 a first memory device comprising a memory array including a plurality of memory segments, and a data register for storing write data prior to being written to one of the memory segments;
 a memory controller comprising a microprocessor for executing access commands received from a host;
 interface circuitry operable to generate control signals that enable the microprocessor to communicate with the first memory device; and
 power fail circuitry operable to transmit a flush command to the first memory device through the interface circuitry independent of the microprocessor in response to a power fail signal, wherein the first memory device responds to the flush command by transferring the write data stored in the data register to the memory segment.

2. The non-volatile semiconductor memory as recited in claim 1, wherein the power fail signal comprises a dedicated control line.

3. The non-volatile semiconductor memory as recited in claim 1, wherein the flush command comprises 10h.

4. The non-volatile semiconductor memory as recited in claim 1, further comprising a second memory device, wherein the power fail circuitry is further operable to configure the interface circuitry in order to transmit the flush command to the first memory device and configure the interface circuitry in order to transmit the flush command to the second memory device in response to the power fail signal.

5. The non-volatile semiconductor memory as recited in claim 1, wherein the data register comprises a cache register.

6. The non-volatile semiconductor memory as recited in claim 1, further comprising a secondary power supply for powering the power fail circuitry, the interface circuitry, and the memory device in response to the power fail signal.

7. The non-volatile semiconductor memory as recited in claim 1, wherein the power fail circuitry interrupts a current access command being executed by the microprocessor.

8. A method of operating a non-volatile semiconductor memory comprising a first memory device comprising a memory array including a plurality of memory segments, and a data register for storing write data prior to being written to one of the memory segments, and a memory controller comprising a microprocessor for executing access commands received from a host, and an interface circuitry operable to generate control signals that enable the microprocessor to communicate with the first memory device, the method comprising:
 detecting a power fail condition; and
 transmitting a flush command to the first memory device through the interface circuitry in response to the detected power fail condition independent of the microprocessor, wherein the first memory device responds to the flush command by transferring the write data stored in the data register to the memory segment.

9. The method as recited in claim 8, wherein the flush command comprises 10h.

10. The method as recited in claim 8, wherein the non-volatile semiconductor memory further comprises a second memory device, the method further comprising configuring the interface circuitry in order to transmit the flush command to the first memory device and configure the interface circuitry in order to transmit the flush command to the second memory device in response to the detected power fail condition independent of the microprocessor.

11. The method as recited in claim 8, wherein the data register comprises a cache register.

12. The method as recited in claim 8, wherein when the power fail condition is detected, further comprising interrupting a current access command being executed by the microprocessor.

* * * * *